United States Patent
Miyatake et al.

(10) Patent No.: US 6,885,208 B2
(45) Date of Patent: Apr. 26, 2005

(54) SEMICONDUCTOR DEVICE AND TEST DEVICE FOR SAME

(75) Inventors: Toshio Miyatake, Chiyoda (JP); Tatsuya Nagata, Ishioka (JP); Hiroya Shimizu, Ryugasaki (JP); Ryuji Kohno, Chiyoda (JP); Hideyuki Aoki, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/218,596

(22) Filed: Aug. 15, 2002

(65) Prior Publication Data

US 2003/0047731 A1 Mar. 13, 2003

(30) Foreign Application Priority Data

Sep. 12, 2001 (JP) ........................................ 2001-276530

(51) Int. Cl.$^7$ .............................................. G01R 31/26
(52) U.S. Cl. ...................................... 324/763; 324/765
(58) Field of Search .................. 257/786, 48; 324/763, 324/765, 754

(56) References Cited

U.S. PATENT DOCUMENTS

| | | | | |
|---|---|---|---|---|
| 3,825,353 A | * | 7/1974 | Loro | .......................... 257/735 |
| 5,929,650 A | * | 7/1999 | Pappert et al. | ............... 324/763 |
| 6,061,814 A | * | 5/2000 | Sugasawara et al. | ......... 714/724 |
| 6,427,222 B1 | * | 7/2002 | Shau | ............................... 716/4 |
| 6,498,396 B1 | * | 12/2002 | Arimoto | ...................... 257/737 |
| 6,511,857 B1 | | 1/2003 | Kono et al. | |
| 6,597,187 B1 | * | 7/2003 | Eldridge et al. | ............. 324/754 |

FOREIGN PATENT DOCUMENTS

| | | |
|---|---|---|
| CN | 1293824 A | 5/2001 |
| JP | 11-274251 | 8/1999 |
| JP | P2000-227459 A | 8/2000 |
| JP | 2000-332077 | 11/2000 |

* cited by examiner

*Primary Examiner*—Evan Pert
(74) *Attorney, Agent, or Firm*—Antonelli, Terry, Stout & Kraus, LLP

(57) ABSTRACT

A semiconductor device includes a quadrangular semiconductor substrate and a self test circuit formed on the semiconductor substrate. A plurality of pads are formed on the semiconductor substrate, which pads are coupled at least to the self test circuit. The semiconductor substrate includes four rectangular or square regions which each include a respective corner of the quadrangle, and at least two of the pads are respectively located on diagonally opposite ones of the regions from one another.

8 Claims, 6 Drawing Sheets

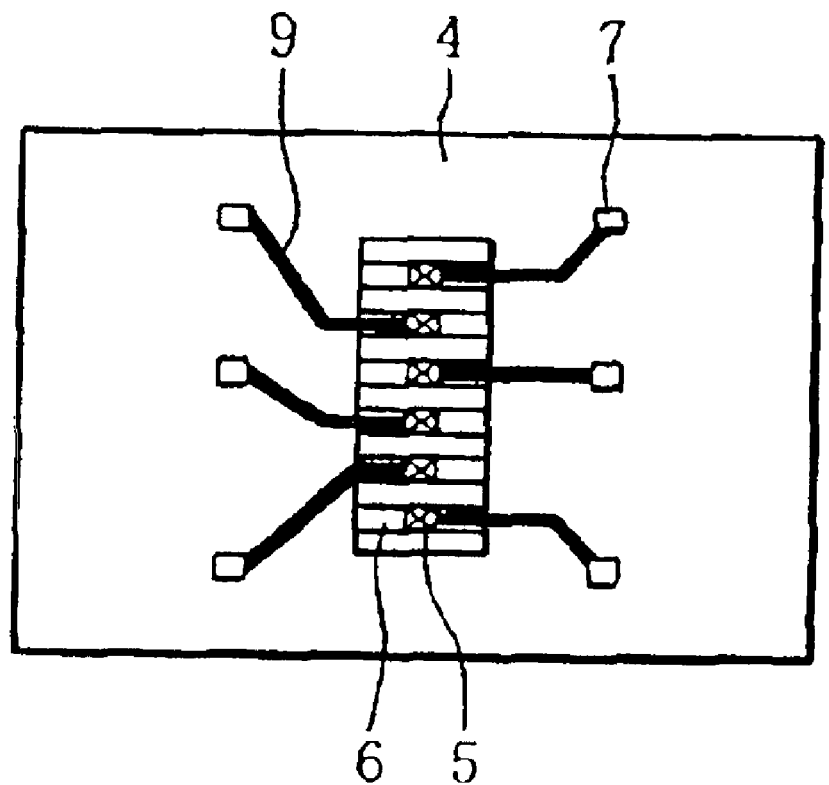

SEMICONDUCTOR DEVICE AND TEST DEVICE FOR SAME

BACKGROUND OF THE INVENTION

1. Technical Field of the Invention

The present invention relates to a semiconductor device and test device for same.

2. Description of the Related Art

There is an increased demand for an increase in integration density in semiconductor devices reflecting the increase of the mount density and functions in the electronic appliances using such semiconductor devices.

The integration increase of semiconductor devices, in general, is achieved by scaling-down the circuit elements configuring such semiconductor devices. Namely, integration increase is done by micro-fabricating the interconnections, connection holes and the like configuring the circuit elements.

On the other hand, in order to reduce the cost and improve the yield of semiconductor devices, there is a need for a technology to increase the number of semiconductor chips formed on one wafer to the greatest possible extent. Namely, there is a necessity for a technology to optimize, for scale-down, the design and manufacturing process such that circuits used for the same function are realized within as small a chip as possible.

For a product group in the same generation realizing the same function, e.g. DRAM (Dynamic Random Access Memory), the design is under a comparatively relaxed condition of design rule in an early stage of placement into the market. Consequently, chip size is comparatively great and cost is somewhat high correspondingly.

However, in the middle or later stage of placement into the market, chip size is reduced as a result of scaling-down efforts. Thus, simultaneous achievement is made on cost reduction per chip and yield improvement.

Such chip-size reduction is made over several times on a product group in the same, generation. Furthermore, chip-size reduction is repeated from generation to generation. As a result, reduction is simultaneously done for the interconnect pattern on the chip surface. Due to this, reduction is natural on the size and pitch of the test pads for testing semiconductor devices.

In this manner, by the increase of test pads due to the increase of chip count per wafer, difficulties tend to arise in testing with the existing test method.

Under such a circumstance, as described in JP-A-11-27451, a testing method has been developed in which probes, beams, interconnections and secondary pads are formed on the same silicon substrate, as a testing substrate, as that of a semiconductor device so that the projecting probes respectively formed on the beams are contacted with a predetermined pad formed on the semiconductor device, thereby conducting a test.

Meanwhile, as described in JP-A-2000-227459, a BIST (Built-In Self Test) circuit has been incorporated on a semiconductor chip to enable a simplified test.

However, there is a further demand for the integration increase on the semiconductor device. Due to the increase of pad count and the reduction of arrangement area, further reduction is required for pad pitch. However, there is a fear of difficulty in fabricating a testing substrate for a test device capable of coping with the pad pitch reduction in the semiconductor devices.

Namely, although the semiconductor-device test device is formed with probes, beams, interconnections and secondary electrode pads on a silicon substrate thereof, as noted above, there is a need to narrow the width of the beam due to the pad pitch reduction in a probe semiconductor device. If the pad arrangement remains as in the conventional structure, problems of strength and difficulties in fabrication of the beams are correspondingly caused.

It is an object of the present invention to realize a semiconductor device in which testing is effectively possible by the test device even where the semiconductor device is reduced in chip size and hence pad pitch.

SUMMARY OF THE INVENTION

In order to achieve the above object, the present invention provides a structure, as follows.

(1) In a semiconductor device having a plurality of input/output pads on a main surface of a semiconductor substrate, the semiconductor device is characterized in that: the plurality of input/output pads are arranged, at least in one line, separately on both ends of the main surface; the plurality of pads including a plurality of testing pads for use in electrical test of the semiconductor device; the testing pads being separated into two groups; the two-separated testing pads being respectively included in a plurality of pads formed in areas in a diagonal arrangement relationship in which the main surface is divided into four areas each including one of the four corners thereof.

(2) In a test device for conducting a test of a semiconductor device having a substrate having a plurality of beams, probes are respectively formed on the beams to contact electrical testing pads formed on a semiconductor device, and a plurality of secondary electrode pads for input/output signals electrically connected to the probes through connection lines, the test device for a semiconductor device characterized in that: the beams are divided into two groups; the probes being formed to be positioned in areas in a diagonal arrangement relationship that are end areas of the substrate in which the substrate is divided into four areas each including one of the four corners thereof.

(3) In a test device for conducting a test on a semiconductor device having a substrate having a plurality of beams, probes are respectively formed on the beams to contact electrical testing pads formed on a semiconductor device, and a plurality of secondary electrode pads are provided for input/output signals electrically connected to the probes through connection lines. The test device for a semiconductor device is further characterized in that the beams are divided into two groups with the probes being formed to be positioned in areas in a diagonal arrangement relationship. The areas are close to a center area of the substrate, and the substrate is divided into four areas each including one of four corners thereof.

(4) In a semiconductor device having a plurality of input/output pads on a main, surface of a semiconductor substrate, the semiconductor device is further characterized in that the plurality of input/output pads are arranged at least in one line separately on both ends of the main surface, the plurality of pads include a plurality of testing pads for use in electrical test of the semiconductor device, and the testing pads being separated into two groups. Two of the separated testing pads are respectively included in a plurality of pads formed in areas in a diagonal arrangement relationship in which the main surface is divided into four areas each including one of four corners thereof. Probe-contacting pads are formed in a one line arrangement in a center area of the main surface and electrically connected to the testing pads, to be contacted with testing probes of a test device.

(5) In a test device for conducting a test on a semiconductor device having a substrate having a plurality of beams, probes are respectively formed on the beams to contact electrical testing pads formed on a semiconductor device. A plurality of secondary electrode pads for input/output signals electrically are connected to the probes through connection lines, and the test device for a semiconductor device is further characterized in that the plurality of beams are formed on a center area of the substrate.

BRIEF DESCRIPTION OF THE DRAWINGS

FIG. 9 is a plan view of the test device of still another embodiment of the invention as viewed at the other surface thereof.

DETAILED DESCRIPTION OF THE PREFERRED EMBODIMENTS

Explanation will now be made of preferred embodiments according to the present invention, with reference to the accompanying drawings.

Figure 1:
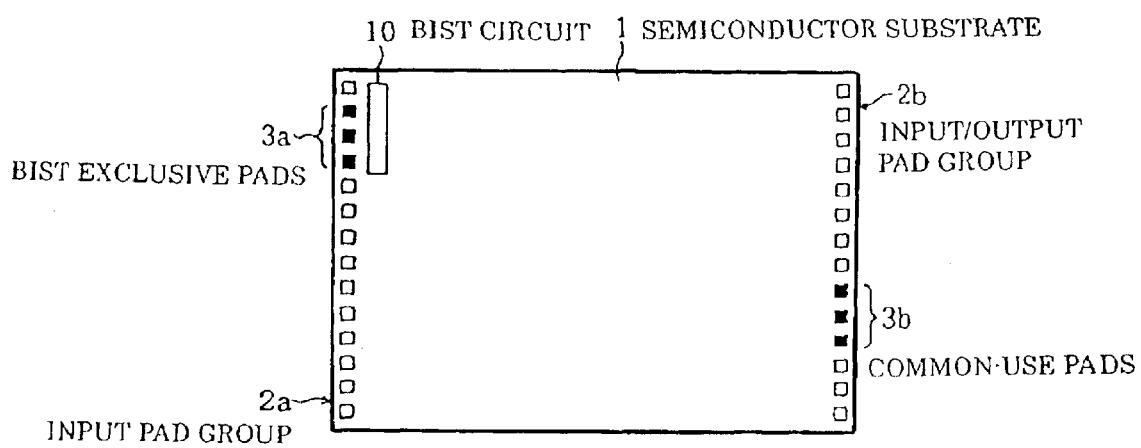
FIG. 1 is an explanatory view of a pad position of a semiconductor device of one embodiment of the present invention.

FIG. 1 is an explanatory view explaining a pad position of a semiconductor device as one embodiment of the invention. In FIG. 1, a plurality of pads 2a, 2b are formed in one line at each of both ends on a main surface of a semiconductor substrate 1. This is a separate arrangement of a plurality of pads at the both ends, in order to cope with the pad count increase and pad pitch decrease due to scale-down of the semiconductor device with increased circuit elements.

Thus, an input pad group 2a is arranged at a left end of the semiconductor device 1 while an input pad group 2b is at a right end of the semiconductor device 1.

A BIST (Built-In Self Test) circuit 10 is arranged at an upper left area of the semiconductor device 1 of FIG. 1. The pads positioned close to the BIST circuit 10 serve as BIST exclusive pads 3a.

In general, it is necessary to provide a multiplicity of BIST pads. However, the area for arranging BIST pads is restricted by the increase of input pads. Therefore, it is impossible to arrange all the BIST pads in one line at one end side of the semiconductor device 1.

For this reason, the arrangement area of BIST pads is divided between the both ends of the semiconductor device.

Furthermore, those pads arranged close to the BIST circuit 10 are given as BIST exclusive pads 3a while those arranged in the other area are pads 3b for common use for both of the BIST and other application.

Furthermore, the BIST pads 3a and 3b are separately arranged in the upper and lower areas of the semiconductor device 1. Specifically, the BIST exclusive pads 3a are arranged in the upper left area of the semiconductor device 1. The common-use pads 3b are arranged in the lower right area of the semiconductor device 1.

The reason for this is as follows. Namely, in case the BIST exclusive pads 3a are arranged in the upper left area of the semiconductor device 1 and the common-use pads 3b in the upper right area of the semiconductor device 1, both the beams forming a probe on a test device to contact the pad 3a and the beams forming a probe to contact the pad 3b must be formed in an upper area of the test device formed by a silicon substrate.

If all of the probes were formed in the upper area of the test device, problems of strength and difficulty in test device fabrication would result.

For this reason, the BIST exclusive pads 3a are arranged in the upper left area of the semiconductor device 1, while the common-use pads 3b are in the lower right area of the semiconductor device 1. Due to this, the beams of the test device are separately arranged in the upper left area and the lower right area of the silicon substrate. This eliminates the necessity of forming a multiplicity of the beams only in the upper or lower area of the silicon substrate of the test device. This can eliminate the aforementioned problems of strength and the difficulties in test device fabrication.

Herein, the upper left area refers to an end-sided area in a position of a distance of from a one-pad length to a one-to-two pad length, as measured from a left end surface of the semiconductor substrate 1 of FIG. 1, which is an upper area where the semiconductor substrate 1 is vertically divided into two in FIG. 1.

Meanwhile, the lower right area refers to an end-sided area in a position of a distance of from a one-pad length to a one-to-two pad length, as measured from a right end surface of the semiconductor substrate 1 of FIG. 1, which is a lower area where the semiconductor substrate 1 is vertically divided into two in FIG. 1.

Accordingly, the pads 3a and 3b are included in respective pad groups formed in a diagonal positional relationship where the main surface of the semiconductor substrate 1 is divided into four regions each including one of the four corners of the main surface.

Figure 2:
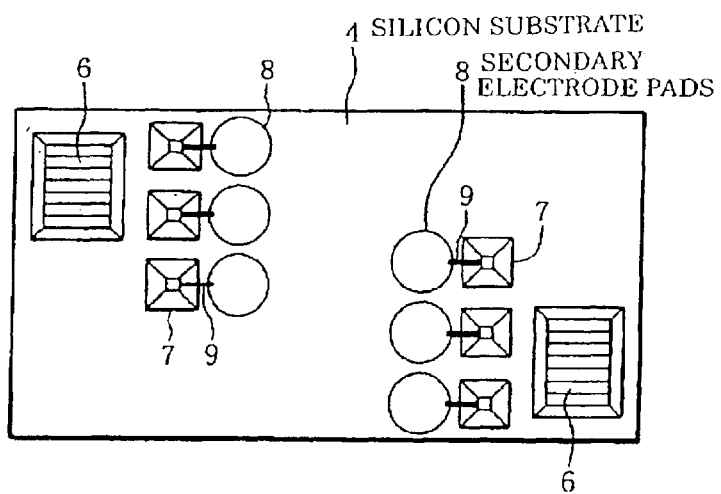
FIG. 2 is a plan view of a test device of one embodiment of the invention as viewed at one surface thereof.

FIG. 2 is a plan view of a test device as one embodiment of the invention as viewed at one surface thereof. Meanwhile, FIG. 3 is a plan view of the test device of the embodiment of the invention as viewed at the other surface thereof.

Figure 3:
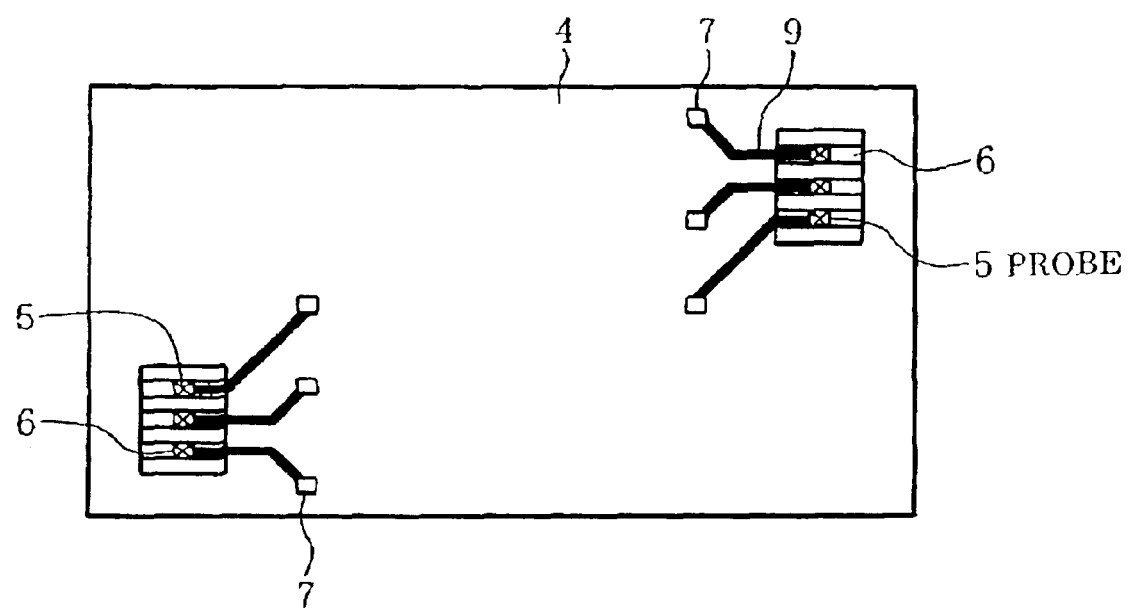
FIG. 3 is a plan view of the test device of one embodiment of the invention as viewed at another surface thereof.

In FIG. 3, a plurality of beams are formed separately in the upper left area and in the lower right area on the other surface of the silicon substrate 4. Probes 5 are formed respectively on these beams. These probes 5 are arranged in the positions corresponding to the BIST exclusive pads 3a and common-use pads 3b such they are to be contacted with the pads 3a and the pads 3b.

Each probe 5 is connected to a metal line 9, and the metal line 9 extends to one surface of the silicon substrate 4 via a through-hole 7.

As shown in FIG. 2, the metal line 9 is connected to a secondary electrode pad 8. The secondary electrode pad 8 is to be supplied with a test signal from a test signal generator circuit (not shown).

Meanwhile, the semiconductor device in general undergoes a test, as described in the following discussion, wherein the test is conducted by providing conduction between the plurality of test pads 3a, 3b formed on the semiconductor substrate and a tester.

There are included a test for conduction on a signal of each element, called a P-test, and a test of applying a thermal electric stress to a circuit to accelerate-select an abnormality, called a bar-in test. The P-test usually uses a probe device, to contact the probes, one by one, to an electrode pad of a circuit.

On the other hand, in bar-in test, the use of a BIST circuit 10 makes it possible to reduce the pads required in the test to as little as six per chip. The BIST circuit refers to a circuit for test previously fabricated in a semiconductor device itself. This, herein, is a circuit for collectively extending out power-source and signal lines minimally required in the test.

The test described above is conducted with a test device shown in FIGS. 2 and 3.

As described above, according to the semiconductor device of the embodiment of the invention, a plurality of input/output pads are arranged separately in the opposite ends of a semiconductor device. Of these plural pads, the arrangement area of BIST pads are separately provided in an upper area at one end of the semiconductor device and in a lower area at the other end thereof. The BIST pads arranged in one area are to be used in common to the other applications.

Due to this, even where a semiconductor device is reduced in chip size and hence in pad pitch, a semiconductor device is realized which allows for effective testing by the use of a test device.

Meanwhile, in a test device for a semiconductor device, by arranging a multiplicity of beams separately in the upper left area of the silicon substrate and in the lower right area, i.e. by dividing a multiplicity of beams into two groups so that, when the silicon substrate is divided into four areas each including one of the four corners thereof, probes are formed positioned in end areas in a diagonal relationship of the silicon substrate. Due to this, there is no need to form the multiplicity of beams only in the upper or lower area of the silicon substrate. This can eliminate the problem of strength and difficulty in test device fabrication.

Accordingly, for a semiconductor device reduced in chip size and hence in pad pitch, a test device is realized which is capable of conducting an effective test.

Meanwhile, a scheme has recently been adopted for collectively conducting tests on a plurality of semiconductor devices by the use of a plurality of test devices, i.e. a scheme for testing a plurality of semiconductor devices on a wafer, prior to cutting the wafer into chips, by means of a plurality of test devices.

Explanation, in this case, will be made on a test device as another embodiment of the invention.

Figure 4:
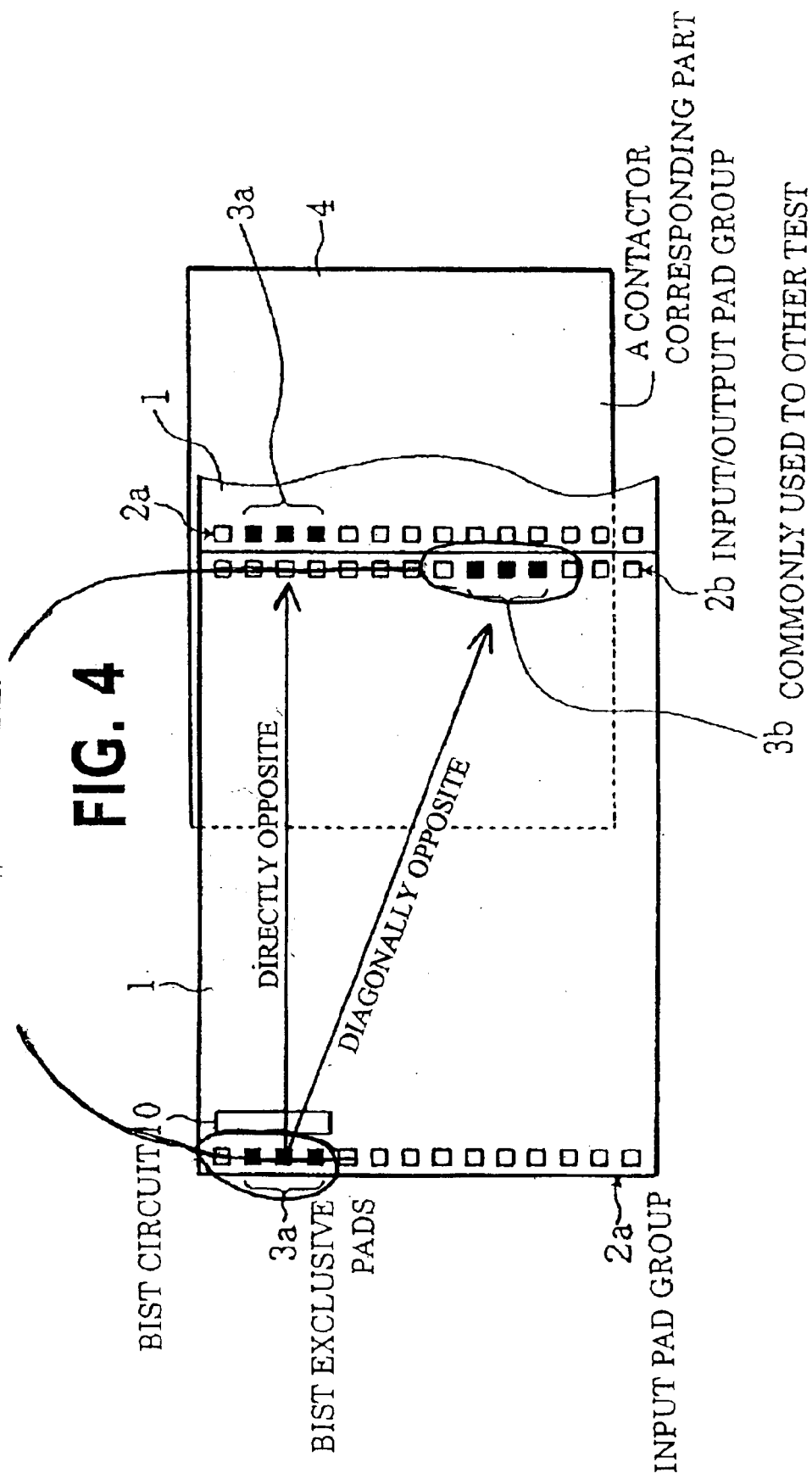
FIG. 4 is an explanatory view of a test device of another embodiment of the invention.

FIG. 4 is an explanatory view in a state of a test on a plurality of arrangements of the semiconductor devices 1 of the embodiment of the invention.

A plurality of the semiconductor devices 1 are arranged adjacent to one another. By one test device, testing is conducted with the common-use pads 3b of one semiconductor device 1 and with the BIST exclusive pads 3a of another semiconductor device 1.

Figure 5:
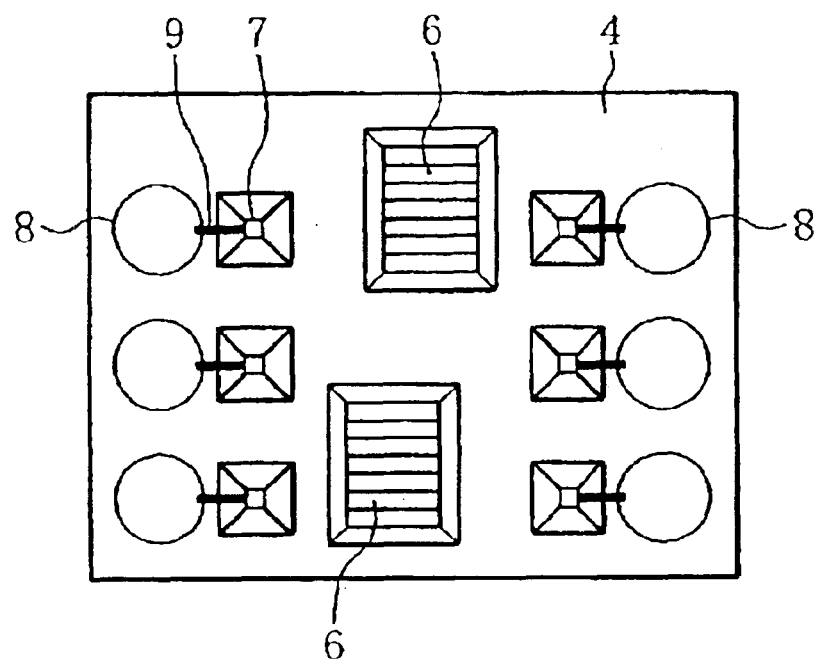
FIG. 5 is a plan view of the test device of the other embodiment of the invention as viewed at one surface thereof.
Figure 6:
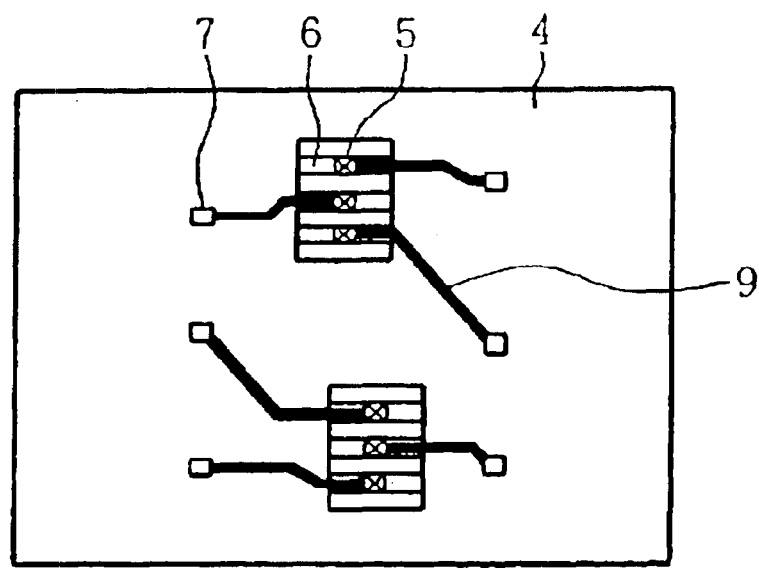
FIG. 6 is a plan view of the test device of the other embodiment of the invention as viewed at the other surface thereof.

FIG. 5 is a plan view of one surface of a test device of another embodiment of the invention. FIG. 6 is a plan view of the other surface of the test device of that other embodiment of the invention.

In FIG. 6, a plurality of beams 6 are formed separately in a central upper left area and in a central lower right area on the other surface of the silicon substrate 4. A plurality of the beams 6 are formed with respective probes 5. The probes 5 are arranged in positions corresponding to pads 3a and 3b such that they can be contacted with the BIST exclusive pads 3a of the one semiconductor device 3a and the common-use pads 3b of the other semiconductor device 1.

Namely, the plurality of beams 6 are divided into two groups and formed such that, when the substrate is divided into four areas, each including one of the four corners of the substrate 4, the probes 5 are positioned in the areas in a diagonal arrangement relationship positioned close to the center area of the substrate.

Each probe 5 is connected to a metal line 9, and the metal line 9 extends to the one surface of the silicon substrate 4 via a through-hole 7.

As shown in FIG. 5, the metal line 9 is connected to a secondary electrode pad 8 arranged on the both ends of the silicon substrate 4. The secondary electrode pads 8 is to be supplied with a test signal from a test signal generator circuit (not shown).

As described above, according to the test device of the other embodiment, a test device can be realized which is capable of conducting an effective test even on a semiconductor device reduced in chip size and hence in pad pitch.

Figure 7:
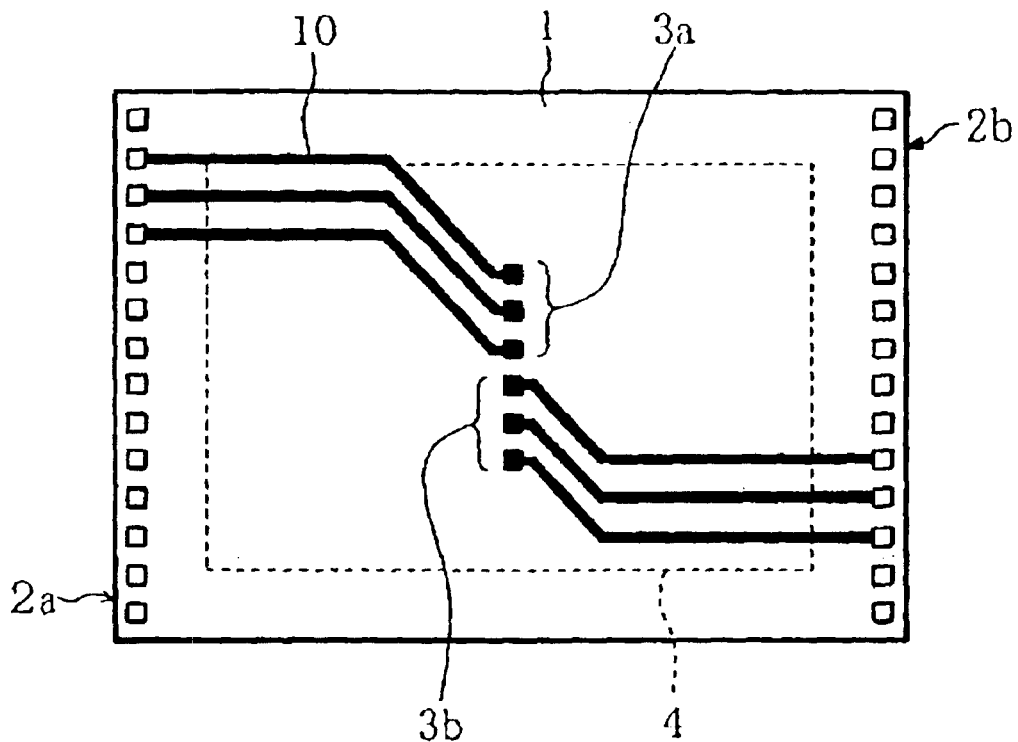
FIG. 7 is an explanatory view on a pad position of a semiconductor device of the other embodiment of the invention.

FIG. 7 is an explanatory view of a pad position on a semiconductor device as another embodiment of the invention. In FIG. 7, a plurality of pads 2a, 2b are formed at both ends of a semiconductor substrate 1. In a center area of the semiconductor device 1, there are formed BIST exclusive pads 3a (pads for probe contact) and common-use pads 3b (pads for probe contact). The BIST exclusive pads 3a are connected to the pads 2a in the upper left area of the semiconductor device 1 by lines 10. The common-use pads 3b are connected to the pads 2b in the lower right area of the semiconductor device 1 by lines 10.

The FIG. 7 example is an example of a case in which there is a free space existing in the center area of the semiconductor device 1 to form pads 3a, 3b or a re-interconnection layer is further formed on a semiconductor device to enable the formation of pads in a center area of the semiconductor device as in a WPP arrangement (Wafer Process Package).

Figure 8:
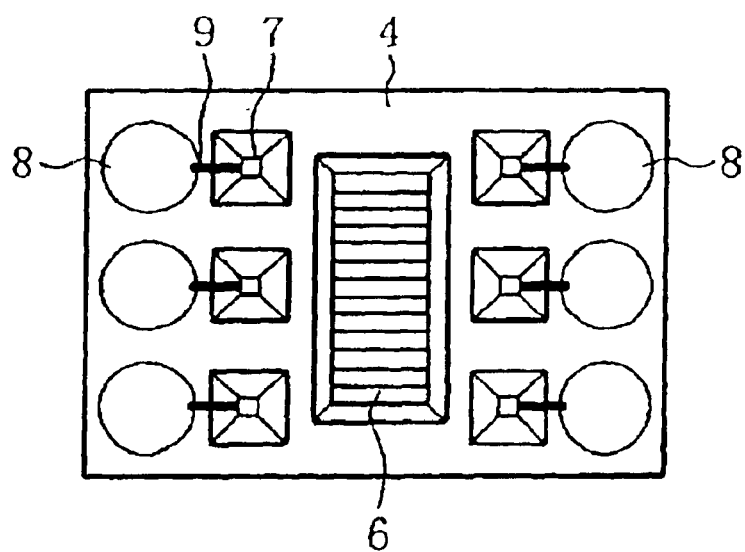
FIG. 8 is a plan view of a test device of still another embodiment of the invention as viewed at one surface thereof.

FIG. 8 is a test device for testing a semiconductor device shown in FIG. 1, which is a plan view on one surface of a test device, as still another embodiment of the invention. FIG. 9 is a plan view on the other surface of the test device shown in FIG. 8.

In FIG. 9, a plurality of beams 6 are formed in a center area on the other surface of the silicon substrate 4.

The plurality of beams 6 are formed with respective probes 5. These probes 5 are arranged in a position corresponding to the pads 3a and 3b such that they can be contacted with the BIS exclusive pad 3a and common-use pads 3b of the semiconductor device 1.

Each probe 5 is connected to a metal line 9, and the metal line 9 extends to the one surface of the silicon substrate 4 via a through-hole 7.

As shown in FIG. 8, the metal line 9 is connected to a secondary electrode pad 8 arranged at both ends of the silicon substrate 4. The secondary electrode pad 8 is to be supplied with a test signal from a test signal generator circuit (not shown).

As described above, according to the test device of the other embodiment, a test device can be realized which is capable of conducting an effective test even on a semiconductor device reduced in chip size and hence in pad pitch.

Also, a test device can be realized which is capable of conducting an effective test even for a semiconductor device reduced in chip size and hence in pad pitch.

Meanwhile, according to a test device of the still other embodiment of the invention, because the multiplicity of beams 6 are formed without separation into two locations, it is possible to decrease the entire area required for the test device and secure much more positioning space for testing.

Incidentally, in the semiconductor device as the embodiment of the invention, the input/output pad groups 2a, 2b are determined in their pad-forming area, and the number of pads to be formed depends upon what position they can be formed at relative an end surface of the semiconductor substrate 2. For example, in the embodiment of the invention, the area for forming the pads can be provided at a one-pad length from an end surface of the semiconductor substrate 2.

According to the present invention, even for a semiconductor device reduced in chip size and hence in pad pitch, a semiconductor device, and test device for the same, can be realized which is capable of effectively conducting a test by a test device.

What is claimed is:

1. A semiconductor device comprising:
    a semiconductor substrate, wherein said semiconductor substrate is a quadrangle;
    a self test circuit formed on said semiconductor substrate; and
    a plurality of pads which are formed on said semiconductor substrate, wherein said plurality of pads are coupled at least to said self test circuit, and wherein respective ones of said plurality of pads are located on opposite sides of the semiconductor substrate from one another,
    wherein said semiconductor substrate includes four rectangular or square regions which each include a respective corner of said quadrangle, and wherein at least two of said pads are respectively located on diagonally opposite ones of said regions from one another, and
    wherein none of said plurality of pads coupled to said self test circuit are located directly opposite one another on said opposite sides of the semiconductor substrate.

2. A semiconductor device according to claim 1, wherein each of said plurality of pads is formed in a line parallel to a side of said quadrangle.

3. A semiconductor device a semiconductor substrate, wherein said semiconductor substrate is a quadrangle;
    a self test circuit formed on said semiconductor substrate; and
    a plurality of pads which are formed on said semiconductor substrate, wherein said plurality of pads are coupled at least to said self test circuit,
    wherein said semiconductor substrate includes four rectangular or square regions which each include a respective corner of said quadrangle, and wherein at least two of said pads are respectively located on diagonally opposite ones of said regions from one another,
    wherein at least two additional pads are respectively connected to said at least two pads, and wherein said at least two additional pads are formed in a line in a central region of said semiconductor substrate.

4. A semiconductor device comprising:
    a semiconductor substrate, wherein said semiconductor substrate is a quadrangle, wherein a first side of said quadrangle and a third side of said quadrangle are parallel to one another and a second side of said quadrangle and a fourth side of said quadrangle are parallel to one another;
    a self test circuit formed on said semiconductor substrate;
    a plurality of pads which are formed on said semiconductor substrate, wherein said plurality of pads are coupled to at least said self test circuit, and wherein respective ones of said plurality of pads are located on opposite sides of the semiconductor substrate from one another;
    wherein said semiconductor substrate includes first and second quadrangular regions formed by using a line parallel to said first side to divide said quadrangle, and wherein at least one of said pads is formed on said first quadrangular region in an area adjacent to a corner of the quadrangle formed by said first and second sides of said quadrangle, and wherein at least another one of said pads is formed on said second quadrangular region in an area adjacent to a corner formed by said third and fourth sides of said quadrangle, and
    wherein none of said plurality of pads coupled to said self test circuit are located directly opposite one another on said opposite sides of the semiconductor substrate.

5. A semiconductor testing apparatus comprising:
    a semiconductor substrate, wherein said semiconductor substrate is a quadrangle, wherein a first side of said quadrangle and a third side of said quadrangle are parallel to one another and a second side of said quadrangle and a fourth side of said quadrangle are parallel to one another;
    a plurality of beams formed on said semiconductor substrate;
    a plurality of probes, wherein each of said probes is formed on a corresponding one of said beams; and
    a plurality of pads each electrically connected to a corresponding one of said probes, wherein respective ones of said plurality of pads are located on opposite sides of the semiconductor substrate from one another;
    wherein said semiconductor substrate includes first and second quadrangular regions formed by using a line parallel to said first side to divide said quadrangle and wherein at least one of said probes is formed on said first quadrangular region in an area adjacent to a corner of the quadrangle formed by said first and second sides, and wherein at least another one of said probes is formed on said second quadrangular region in an area adjacent to a corner formed by said third and fourth sides of said quadrangle,
    wherein none of said plurality of pads connected to said probes are located directly opposite one another on said opposite sides of the semiconductor substrate.

6. A semiconductor wafer comprising:
    first and second semiconductor devices formed adjacent one another on said semiconductor wafer, wherein each of said semiconductor devices comprises:
    a semiconductor substrate, wherein said semiconductor substrate is a quadrangle;
    a self test circuit formed on said semiconductor substrate; and
    a plurality of pads which are formed on said semiconductor substrate, wherein said plurality of pads are coupled at least to said self test circuit, wherein said semiconductor substrate includes four rectangular or square regions which each include a respective corner of said quadrangle, and wherein at least two of said pads are respectively located on diagonally opposite ones of said regions from one another, and wherein said first and second semiconductor devices are located adjacent one another such that an upper corner of such first semiconductor device is adjacent an upper corner of the second semiconductor device and a lower corner of the first semiconductor device is located adjacent a lower corner of the second semiconductor device, and further wherein one of said pads of said first semiconductor device is located adjacent said upper corner of the first semiconductor device and one of the pads of the second semiconductor device is located adjacent said lower corner of the second semiconductor device.

7. A semiconductor wafer according to claim 6, wherein each of said plurality of pads is formed in a line parallel to a side of said quadrangle for each of said first and second semiconductor devices.

8. A semiconductor wafer according to claim 6, wherein, in each of said first and second semiconductor devices, at least two additional pads are respectively connected to said at least two pads, and wherein said at least two additional pads are formed in a line in a central region of said semiconductor substrate.

* * * * *